United States Patent [19]
Noda

[11] Patent Number: 6,094,083
[45] Date of Patent: Jul. 25, 2000

[54] VOLTAGE CONVERTING BUFFER CIRCUIT CAPABLE OF REALIZING HIGH SPEED FLIP-FLOP ACTION IN THE FLIP-FLOP CIRCUIT

[75] Inventor: Kazuo Noda, Tokyo, Japan

[73] Assignee: NEC Corporation, Tokyo, Japan

[21] Appl. No.: 09/219,937

[22] Filed: Dec. 23, 1998

[30] Foreign Application Priority Data

Dec. 24, 1997 [JP] Japan ................................. 9-355843

[51] Int. Cl.[7] ............................................. H03L 5/00
[52] U.S. Cl. ................................. 327/333; 326/68; 326/81
[58] Field of Search .................................. 327/333, 375, 327/376, 391, 437; 326/63, 68, 80, 81, 85, 87, 91

[56] References Cited

U.S. PATENT DOCUMENTS

| | | | |
|---|---|---|---|
| 4,029,973 | 6/1977 | Kobayashi et al. ...................... | 326/68 |
| 4,450,371 | 5/1984 | Bismack ...................... | 326/80 |
| 5,406,142 | 4/1995 | Nakama et al. ........................ | 326/68 |
| 5,666,070 | 9/1997 | Merritt et al. ............................ | 326/81 |
| 5,669,684 | 9/1997 | Agan ......................................... | 326/81 |

*Primary Examiner*—Timothy P. Callahan
*Assistant Examiner*—An T. Luu

[57] ABSTRACT

A voltage converting buffer circuit includes an inverter for receiving an input data signal to output an inverted data signal, a flip-flop having first and second branches for receiving the input data signal and the inverted data signal, and pull-up transistors for assisting the flip-flop function at the output node when the flip-flop function occurs by a transistor having a smaller driving capability. The pull-up transistors have a conductivity same as the conductivity of transistors having the smaller driving capability. A high-speed flip-flop function can be obtained during a high-to-low or low-to-high signal transition of the input data signal.

7 Claims, 6 Drawing Sheets

VOLTAGE CONVERTING BUFFER CIRCUIT CAPABLE OF REALIZING HIGH SPEED FLIP-FLOP ACTION IN THE FLIP-FLOP CIRCUIT

BACKGROUND OF THE INVENTION (a) Field of the Invention

The present invention generally relates to a voltage converting buffer circuit including a CMOS inverter for inverting input data signal and a flip-flop latch circuit for shifting the voltage level of the inverted data signal, and in particular, to a voltage converting buffer circuit capable of realizing high speed flip-flop action in the flip-flop latch circuit.

(b) Description of the Related Art

Figure 5:
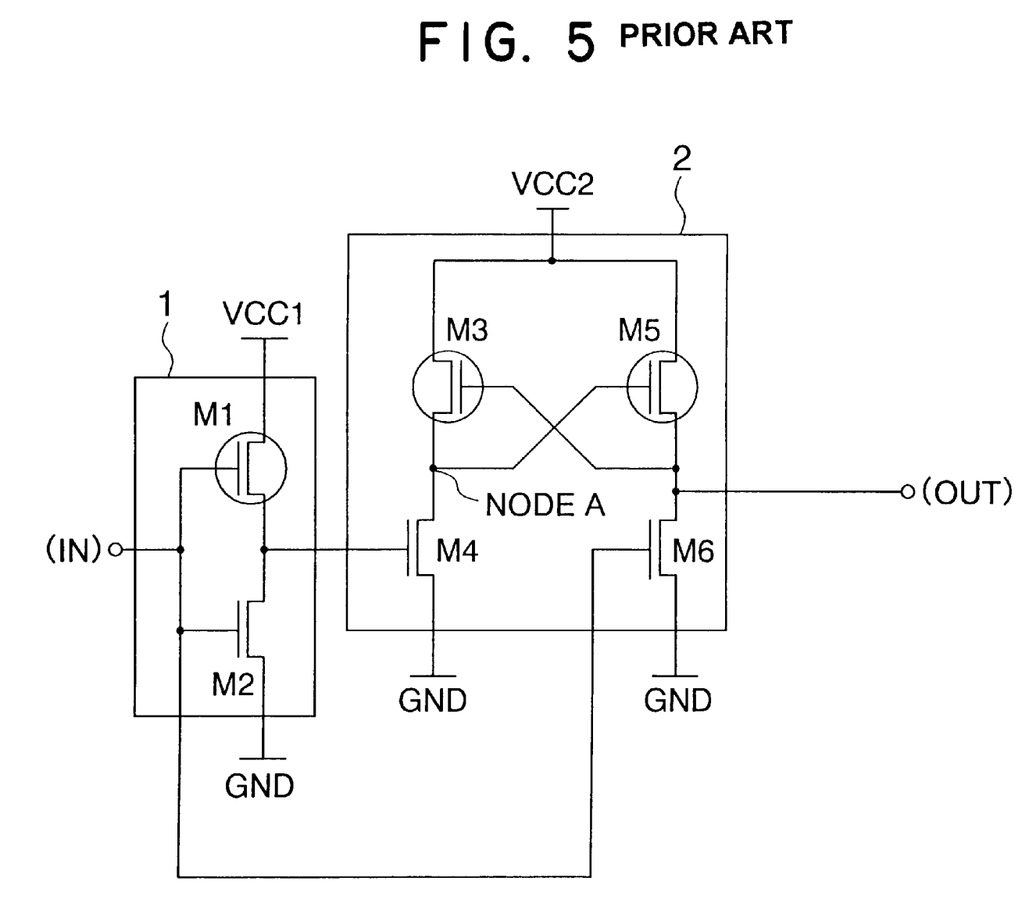
FIG. 5 is a circuit diagram showing a conventional voltage converting buffer circuit.

Voltage converting buffer circuits including a CMOS inverter for inverting input data signal and a flip-flop latch circuit for shifting the voltage level of the inverted data signal are used for converting input data signal supplied from outside to output an inverted data signal having a different potential level. Referring to FIG. 5 showing a conventional voltage converting buffer circuit, the buffer circuit includes an inverter section 1 and a level shifter flip-flop section 2. The inverter section 1 has a CMOS inverter which includes a p-channel MOS transistor M1 and an n-channel MOS transistor M2. The input node IN of the voltage converting buffer circuit is connected to the gates of the p-channel MOS transistor M1 and the n-channel MOS transistor M2. The source of the p-channel MOS transistor M1 is supplied with a power source voltage VCC1, and the source of the n-channel MOS transistor M2 is grounded. The drains of the p-channel MOS transistor M1 and the n-channel MOS transistor M2 are connected together, and the output of the inverter section 1 is supplied to the gate of an n-channel MOS transistor M4 in the level shifter flip-flop section 2. The input node IN of the voltage converting buffer circuit is also connected to an n-channel MOS transistor M6 in the level shifter flip-flop section 2.

The level shifter flip-flop section 2 has a flip-flop latch circuit including a p-channel MOS transistor M3, the n-channel MOS transistor M4, a p-channel MOS transistor M5, and the n-channel MOS transistor M6. A power source voltage VCC2 is supplied to the sources of the p-channel MOS transistors M3 and M5, separately from the power source voltage VCC1, and the gates of transistors M3 and M5 are connected with the drains of the n-channel MOS transistors M6 and M4, respectively.

The drains of the p-channel MOS transistor M3 and the n-channel MOS transistor M4 are connected together. The drains of the p-channel MOS transistor M5 and the n-channel MOS transistor M6 are connected together to the output node OUT of the voltage converting buffer circuit. The sources of the n-channel MOS transistors M4 and M6 are grounded.

When the input node IN is at a high level, the p-channel MOS transistor M1 is OFF and the n-channel MOS transistor M2 is ON, whereby the output of the inverter section 1 is maintained at a low level. Thus, the n-channel MOS transistors M4 and M6 are OFF and ON, respectively, and accordingly, the output node OUT is at a low level (0V).

When the input node IN is at a low level, the p-channel MOS transistor M1 is ON and the n-channel MOS transistor M2 is OFF, whereby the output of the inverter section 1 is maintained at a high level. Thus, the n-channel MOS transistors M4 and M6 are ON and OFF, respectively. Accordingly, the p-channel MOS transistor M5 is ON due to a low level of the gate thereof, and thus the output node OUT is at a high level.

As described above, the input data signal supplied through the input node IN is inverted by the inverter section 1 and the level of the inverted data signal is shifted according to the power source voltage VCC2 by the level shifter flip-flop section 2.

When a signal transition occurs at the input node IN from a low level to a high level, or a high level to a low level, flip-flop action occurs in the level shifter flip-flop section 2, thereby generating a signal transition at the output node OUT from a high level to a low level, or a low level to a high level.

In the voltage converting buffer circuit as described above, if driving capability of the p-channel MOS transistor and the n-channel MOS transistor in the level shifter flip-flop section 2 are equivalent (i.e. balanced), a long time interval is required for the flip-flop action in the level shifter flip-flop section 2, and sometimes the flip-flop action itself is not effected.

Therefore, in the design of the level shifter flip-flop section 2, unbalance is introduced in the driving capability between the p-channel MOS transistors and the n-channel MOS transistors. In the case of FIG. 5, the driving capability of the n-channel MOS transistors is designed to be larger than the driving capability of the p-channel MOS transistors in the level shifter flip-flop section 2.

More specifically, the driving capability of a MOS transistor generally depends on the source-drain current of the MOS transistor, and thus depends on the gate width and the gate length of the MOS transistor. A larger gate width provides a larger driving capability, whereas a larger gate length provides a smaller driving capability. In addition, the driving capability of an n-channel MOS transistor is generally larger than that of a p-channel MOS transistor if both the MOS transistors have equivalent gate widths. Thus, in order to obtain equivalent driving capabilities, the gate widths of the p-channel MOS transistors and the n-channel MOS transistors are set at approximately 2:1 (for example, 10 μm and 5 μm, respectively, for the gate widths). In the buffer circuit of FIG. 5, it is generally determined that the gate widths of the p-channel MOS transistors and the n-channel MOS transistors are set, for example, at 6 μm and 5 μm, respectively, to obtain a larger driving capability for the n-channel transistor.

In the above configuration, the driving capability of the n-channel MOS transistors M4 and M6 is larger than that of the p-channel MOS transistors M3 and M5, to obtain smooth and high speed data transition from a high level to a low level at the output node OUT, and ON current during the signal transition (or flip-flop action) from the high level to the low level is reduced.

Figure 6:
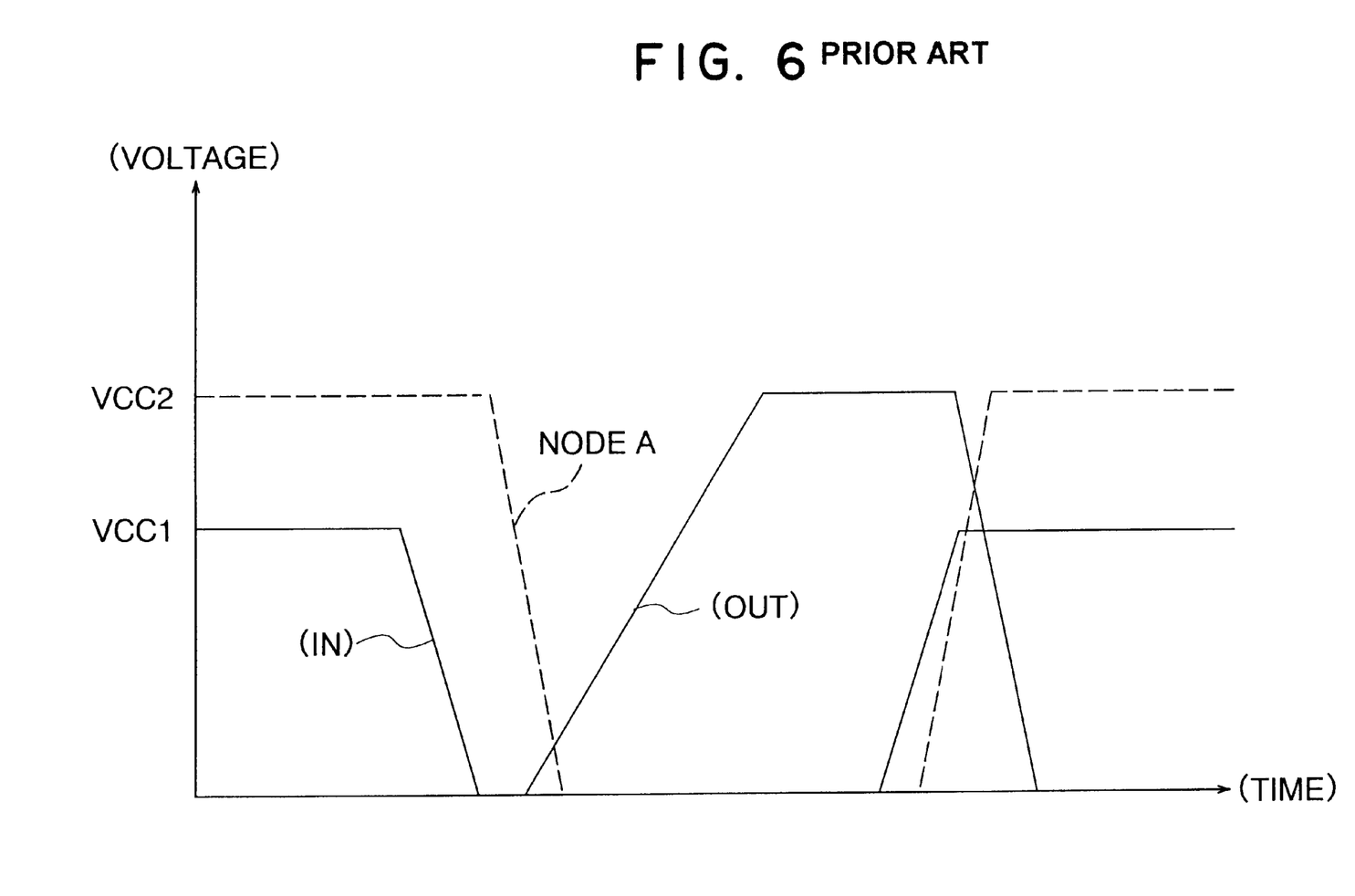
FIG. 6 is a timing chart of the input and the output of the voltage converting buffer circuit of FIG. 5.

In the buffer circuit of FIG. 5, however, the above unbalance in fact results in a slow data transition from a low level to a high level at the output node OUT of the level shifter flip-flop section 2 in the case of input data transition from a high level to a low level at the input node IN of the inverter section 1, as shown in FIG. 6. In addition, the transition itself at the output node OUT does not successfully occur in some cases.

SUMMARY OF THE INVENTION

It is therefore an object of the present invention to provide a voltage converting buffer circuit capable of solving the problem as described above to obtain a high speed flip-flop action of the level shifter flip-flop section 2 in the case of signal transition from a low level to a high level as well as a high level to a low level at the output node of the buffer circuit.

In a preferred embodiment, the present invention provides a voltage converting buffer circuit including an inverter section, a level shifter flip-flop section, and a delayed driving section. The inverter section inverts a data signal input therein. The level shifter flip-flop section includes a flip-flop latch circuit including a pair of p-channel transistors and a pair of n-channel transistors, which form first and second branches each including a p-channel transistor and an n-channel transistor. The level shifter flip-flop section receives the data signal and the inverted data signal, shifts the voltage level of the inverted data signal, and outputs the level shifted inverted data signal.

In the level shifter flip-flop section, unbalance is introduced into driving capability between the p-channel transistors and the n-channel transistors, similarly to the conventional voltage converting buffer circuit. The delayed driving section includes a delay block and a pair of serial pull transistors having a conductivity which is same as the conductivity of the transistors in the level shifter flip-flop section having a smaller driving capability. The delayed driving section assists the driving capability of the transistors in the level shifter flip-flop section having a smaller driving capability for flip-flop action of the level shifter flip-flop.

In a first aspect of the present invention, n-channel transistors in the level shifter flip-flop section have a smaller driving capability, and thus the pair of pull transistors in the delayed driving section are implemented by n-channel MOS transistors. The level shifter flip-flop section includes a first branch including a first p-channel transistor and a first n-channel transistor connected in series, and a second branch including a second p-channel transistor and a second n-channel transistor connected in series. The gate of the first n-channel transistor is supplied with the inverted data signal, with its source grounded. The gate of the second n-channel transistor is supplied with the data signal, with its source grounded. The source of the first p-channel transistor is supplied with a power source voltage for shifting the voltage level of the inverted data signal, with its gate connected with the drain of the second n-channel transistor and an output node of the voltage converting buffer circuit, and with its drain connected with the drain of the first n-channel transistor.

The source of the second p-channel transistor is supplied with the power source voltage for shifting the voltage level of the inverted data signal, with its gate connected to the drain of the first n-channel transistor, and with its drain connected with the drain of the second n-channel transistor. The delayed driving section includes third and fourth p-channel transistors connected in series, and a delay block. The source of the third p-channel transistor is supplied with the power source voltage for shifting the voltage level of the inverted data signal, with its gate connected with the gate of the second p-channel transistor. The source of the fourth p-channel transistor is connected with the drain of the third p-channel transistor, with its drain connected to the output node of the voltage converting buffer circuit and the drains of the second p-channel transistor and the second n-channel transistor. The delay block is connected between the output node of the voltage converting buffer circuit and the gate of the fourth p-channel transistor, for transmitting the level-shifted, inverted data signal to the gate of the fourth p-channel transistor with a predetermined delay time.

Preferably, the delay time of the delay block is set longer than a time length which is needed for the slower flip-flop action in the level shifter flip-flop section.

In a second aspect of the present invention, the unbalance is introduced so that the driving capability of the p-channel transistors is larger than the driving capability of the n-channel transistors in the level shifter flip-flop section. In such a configuration, the gate of the first p-channel transistor is supplied with the inverted data signal, with its source supplied with a power source voltage for shifting the voltage level of the inverted data signal. The gate of the second p-channel transistor is supplied with the data signal, with its source supplied with the power source voltage for shifting the voltage level of the inverted data signal. The source of the first n-channel transistor is grounded, with its drain connected with the drain of the first p-channel transistor, and with its gate connected with the drain of the second p-channel transistor and an output node of the voltage converting buffer circuit. The source of the second n-channel transistor is grounded, with its drain connected with the drain of the second p-channel transistor, and with its gate connected with the drain of the first p-channel transistor.

The delayed driving section includes third and fourth n-channel transistors connected in series, and a delay block. The source of the third n-channel transistor is grounded, with its gate connected with the gate of the second n-channel transistor. The source of the fourth n-channel transistor is connected with the drain of the third n-channel transistor, with its drain connected to the output node of the voltage converting buffer circuit and the drains of the second p-channel transistor and the second n-channel transistor. The delay block is connected between the output node of the voltage converting buffer circuit and the gate of the fourth n-channel transistor, for transmitting the level-shifted, inverted data signal to the gate of the fourth n-channel transistor with a predetermined delay time.

Preferably, the delay time of the delay block is set longer than a time length which is needed for the slower flip-flop action in the level shifter flip-flop section.

The above and other objects, features and advantages of the present invention will be more apparent from the following description, referring to the accompanying drawings.

DESCRIPTION OF THE PREFERRED EMBODIMENTS

Now, the present invention is more specifically described with reference to accompanying drawings, wherein similar constituent elements are designated by similar reference numerals throughout the drawings.

Figure 1:
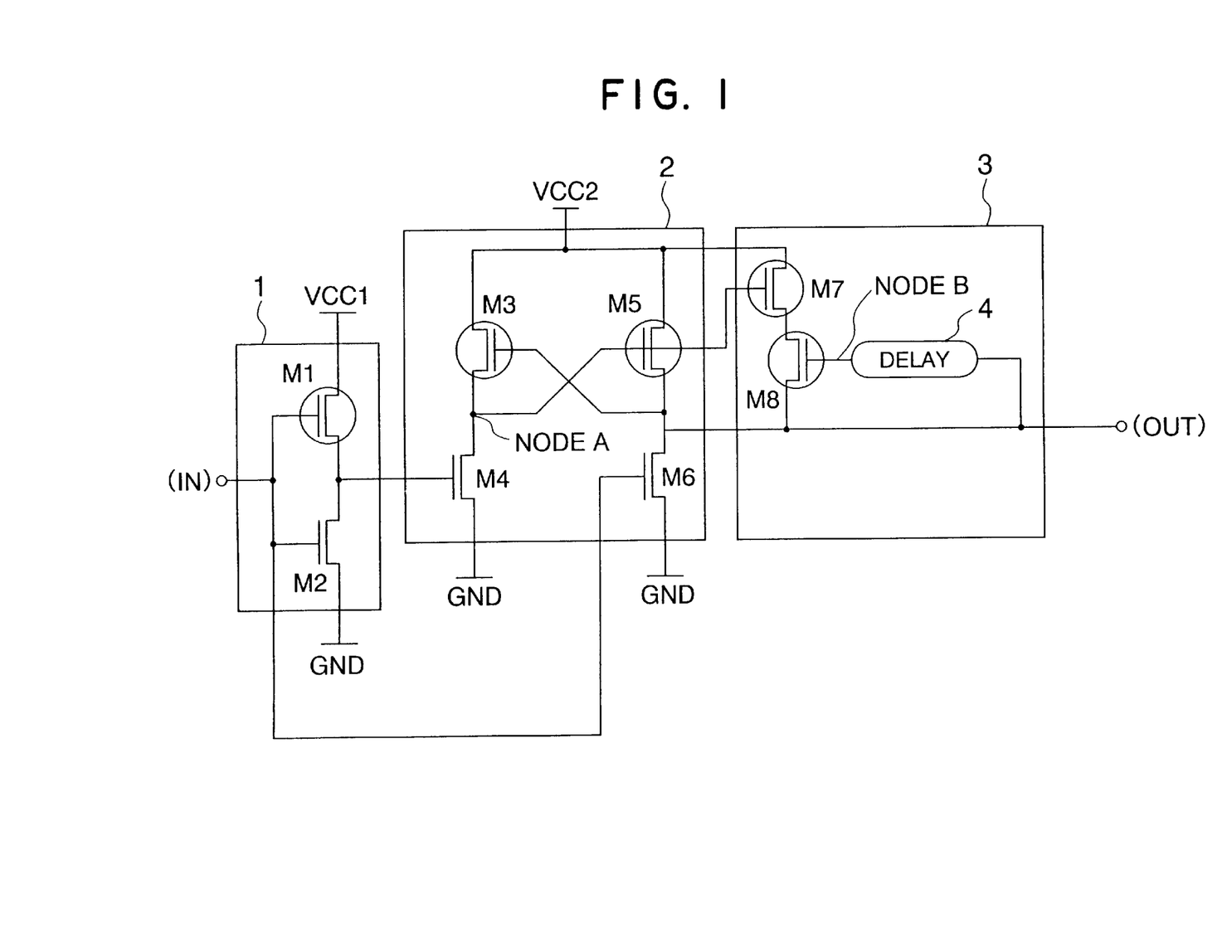
FIG. 1 is a circuit diagram showing a voltage converting buffer circuit according to a first embodiment of the present invention.
Figure 2:
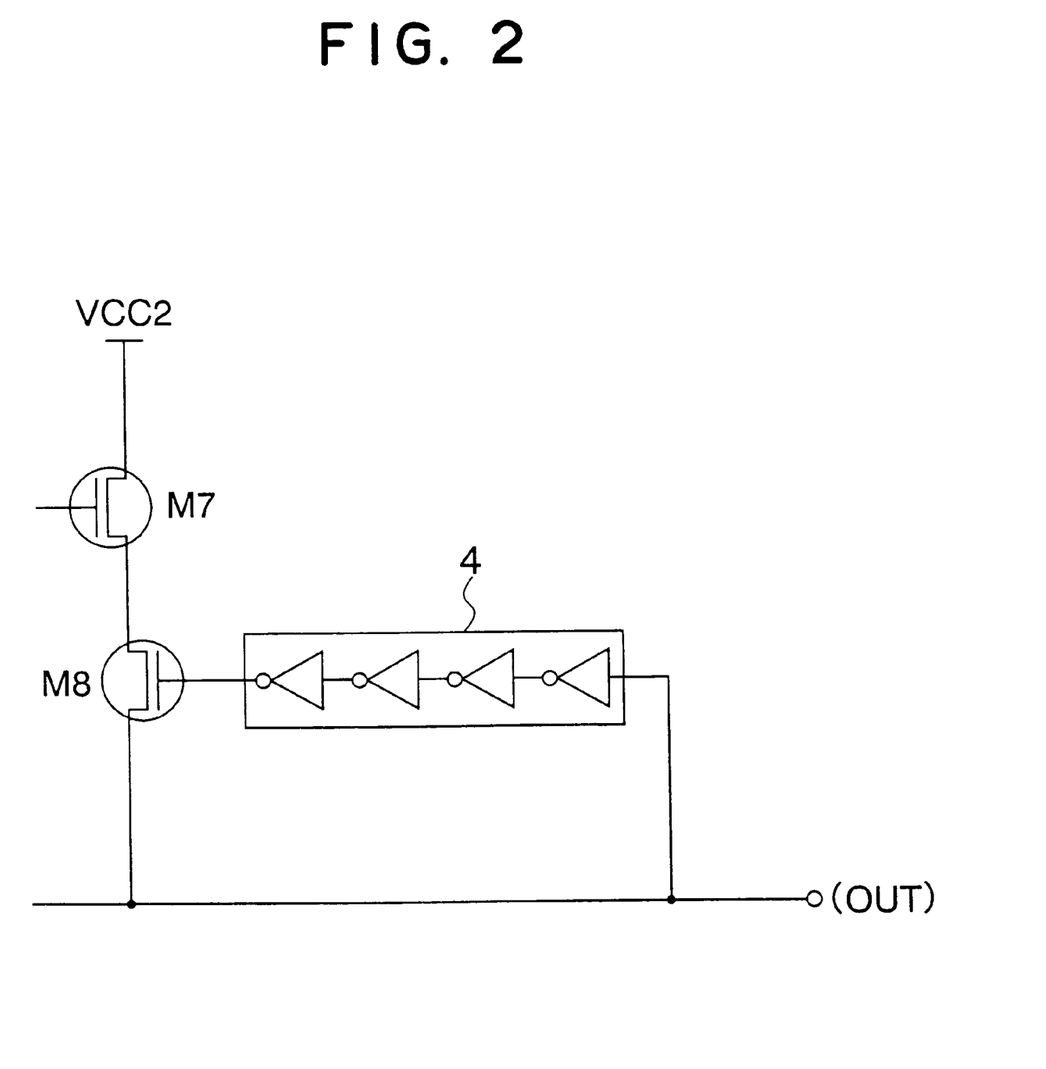
FIG. 2 is a circuit diagram showing a delayed driving section in the voltage converting buffer circuit of FIG. 1.
Figure 3:
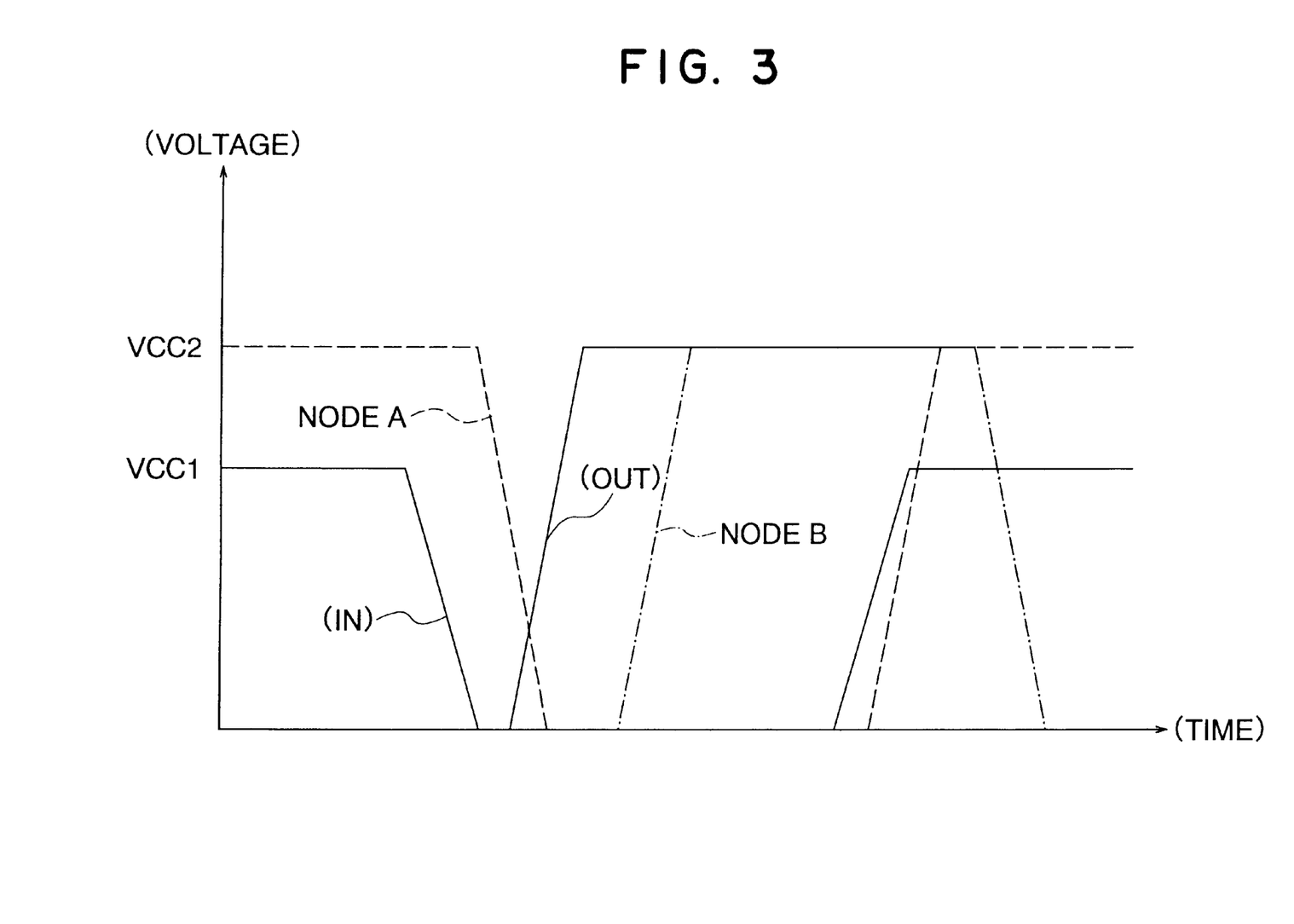
FIG. 3 is a timing chart showing the input and the output of the voltage converting buffer circuit of FIG. 1.

Referring to FIG. 1, a voltage converting buffer circuit according to a first embodiment of the present invention includes an inverter section 1 and a level shifter flip-flop section 2 which are similar to those in the conventional voltage converting buffer circuit of FIG. 5. The voltage converting buffer circuit of the present embodiment further includes a delayed driving section 3. The delayed driving section 3 includes a pair of p-channel pull-up MOS transistors M7 and M8 connected in series between a voltage source line VCC2 and an output node OUT of the level shifter flip-flop section 2, and a delay block 4 having an input connected to the output node OUT and an output connected to the gate of MOS transistor M8 at node B. The delay block 4 includes a chain of cascaded inverter gates such as shown in FIG. 2. In FIG. 2, each inverter gate may include a CMOSFET implementing an inverter which is similar to the inverter section 1.

The inverter section 1 is implemented by a CMOS inverter including a p-channel MOS transistor M1 and an n-channel MOS transistor M2. The input node IN of the voltage converting buffer circuit is connected to the gates of the p-channel MOS transistor M1 and the n-channel MOS transistor M2, the source of the p-channel MOS transistor M1 is supplied with a power source voltage VCC1, and the source of the n-channel OS transistor M2 is grounded. The drains of the p-channel MOS transistor M1 and the n-channel MOS transistor M2 are connected together, and the output of the inverter section 1 is supplied to the gate of an n-channel MOS transistor M4 in the level shifter flip-flop section 2. The input node IN of the voltage converting buffer circuit is also connected to an n-channel MOS transistor M6 in the level shifter flip-flop section 2.

The level shifter flip-flop section 2 is implemented by a flip-flop latch circuit including a pair of branches. The first branch includes a p-channel MOS transistor M3 and the n-channel MOS transistor M4 connected in series, and the second branch includes a p-channel MOS transistor M5 and the n-channel MOS transistor M6 connected in series. The power source voltage VCC2 is supplied to the sources of the p-channel MOS transistors M3 and M5, separately from the power source voltage VCC1, and the gates of MOS transistors M3 and M5 are connected with the drains of the n-channel MOS transistors M6 and M4, respectively. The drains of the p-channel MOS transistor M3 and the n-channel MOS transistor M4 are connected together. The drains of the p-channel MOS transistor M5 and the n-channel MOS transistor M6 are connected together to the output node OUT of the voltage converting buffer circuit. The sources of the n-channel MOS transistors M4 and M6 are grounded. The first and second branches are connected so as to implement a flip-flop function between the first branch and the second branch.

If driving capabilities of the p-channel MOS transistor and the n-channel MOS transistor in the level shifter flip-flop section 2 are equivalent (i.e. balanced), a large time length is required for the flip-flop action of the level shifter flip-flop section 2, and sometimes, the flip-flop action itself does not occur. Thus, unbalance is introduced in the driving capability of the MOS transistors in the level shifter flip-flop section 2, in which the driving capability of the n-channel MOS transistors M4 and M6 is designed to be larger than the driving capability of the p-channel MOS transistors M3 and M5.

In general, the driving capability of a MOS transistor depends on the source-drain current of the MOS transistor, and thus depends on the gate width and the gate length of the MOS transistor. A larger gate width provides a larger driving capability, whereas a larger gate length provides a smaller driving capability. In addition, the driving capability of an n-channel MOS transistor is generally larger than that of a p-channel MOS transistor if the gate widths are equivalent. Thus, in order to set the driving capability of the p-channel MOS transistors equivalent to that of the n-channel MOS transistor, the gate widths of the p-channel MOS transistor and the n-channel MOS transistor are set at approximately 2:1 (for example, 10 $\mu$m and 5 $\mu$m, respectively, for the gate widths).

Therefore, in the present embodiment, the driving capability of the n-channel MOS transistors M4 and M6 is set larger than that of the p-channel MOS transistors M3 and M5, by setting the gate widths of the p-channel MOS transistors M3 and M5 and the n-channel MOS transistors M4 and M6 at 6 $\mu$m and 5 $\mu$m, respectively, for example.

In the delayed driving section 3, the source of the p-channel MOS transistor M7 is supplied with the power source voltage VCC2. The gate of the p-channel MOS transistor M7 is connected with the gate of the p-channel MOS transistor M5. The drain of the p-channel MOS transistor M7 is connected to the source of the p-channel MOS transistor M8, and the drain of the p-channel MOS transistor M8 is connected to the output of the level shifter flip-flop section 2 (i.e. the node connecting the drains of the p-channel MOS transistor M5 and the n-channel MOS transistor M6 together), which constitutes the output node OUT of the voltage converting buffer circuit.

The delay block 4 is connected between the output node OUT and the gate of the p-channel MOS transistor M8, so as to deliver the output of the level shifter flip-flop section 2 to the gate of the p-channel MOS transistor M8 with a predetermined delay time.

In operation of the voltage converting buffer circuit of FIG. 1, when the input node IN is at a high level, the gate of the p-channel MOS transistor M1 is OFF and the gate of the n-channel MOS transistor M2 is ON, whereby the output of the inverter section 1 is maintained at a low level. Thus, the n-channel MOS transistors M4 and M6 are OFF and ON, respectively, and accordingly, the output node OUT is at a low level (i.e., 0V). When the input node IN is at a low level, the p-channel MOS transistor M1 is ON and the n-channel MOS transistor M2 is OFF, whereby the output of the inverter section 1 is maintained at a high level. Thus, the n-channel MOS transistors M4 and M6 are ON and OFF, respectively. Accordingly, the p-channel MOS transistor M5 is ON due to a low level at the gate thereof, and thus the output node OUT is at a high level (VCC2). In short, the input data signal supplied through the input node IN is inverted by the inverter section 1, whereas the level of the inverted data signal is shifted to the power source voltage VCC2 by the level shifter flip-flop section 2.

When input data signal is shifted from a low level to a high level at the input node IN, the n-channel MOS transistor M2 turns ON, which in turn pulls the gate of the n-channel MOS transistor M4 down to a low level. At the same time, the n-channel MOS transistor M6 is turned ON, and pulls the output node OUT down to a low level. Then, the p-channel MOS transistor M3 is turned ON to pull the node "A" connecting the drains of the MOS transistors M3 and M4 together up to a high level. Thus, both the p-channel MOS transistor M5 and M7 are turned OFF. Thereafter, the low level of the output node OUT is transmitted through the delay block 4 and turns the p-channel MOS transistor M8 ON. Thus, the output node OUT falls from a high level to a low level based on the signal transition of the input node from a low level to a high level.

When an input data signal at the input node IN falls from a high level to a low level, the p-channel MOS transistor M1 turns ON, and the n-channel MOS transistors M2 and M6 turn OFF. Thus, the p-channel MOS transistor M1 pulls the gate of the n-channel MOS transistor M4 to a high level, thereby turning MOS transistor M4 ON, which then turns the p-channel MOS transistors M5 and M7 ON. Only at this instant, all the p-channel MOS transistors M5, M7 and M8 are ON at the same time. Thus, the combined driving current from the p-channel MOS transistors M5, M7 and M8 pulls the output node OUT up to a high level with a high speed. Thereafter, the high level of the output node OUT is transmitted through the delay block 4 and turns the p-channel MOS transistor M8 OFF. Thus, the output node OUT rises from a low level to a high level with a high speed by responding to a signal transition from a low level to a high level at the input node IN.

As described above, in the voltage converting buffer circuit according to the present embodiment, a high speed transition at the output node OUT can be obtained from a low level to a high level, as well as a high level to a low level, due to the delayed driving section 3 including the delay block 4 and the p-channel pull-up MOS transistors M7 and M8 for assisting the signal transition from a low level to a high level at the output node OUT.

Figure 4:
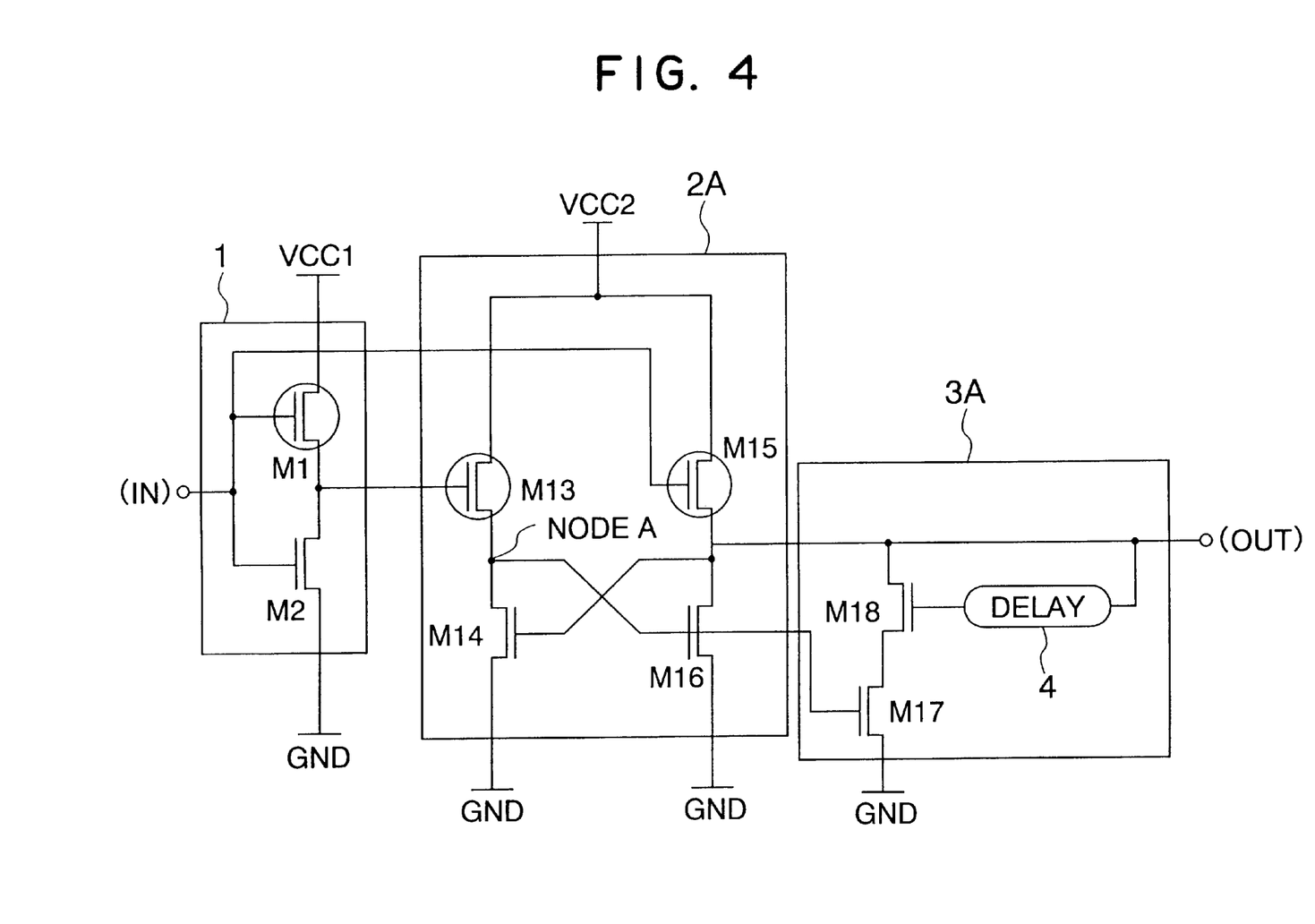
FIG. 4 is a circuit diagram showing a voltage converting buffer circuit according to a second embodiment of the present invention.

Referring to FIG. 4, a voltage converting buffer circuit according to a second embodiment of the present invention includes an inverter section 1 and a level shifter flip-flop section 2A, and a delayed driving section 3A. The delayed driving section 3A includes n-channel pull-down MOS transistors M17 and M18, and a delay block 4. The delay block 4 includes a chain of cascaded inverter gates which are similar to the delay block of FIG. 2.

The inverter section 1 is implemented by a CMOS inverter which is similar to that in the first embodiment. In the second embodiment, the output of the inverter section 1 is supplied to the gate of a p-channel MOS transistor M13 of the first branch in the level shifter flip-flop section 2A. The input node IN of the voltage converting buffer circuit is connected to the gate of a p-channel MOS transistor M15 of the second branch in the level shifter flip-flop section 2A.

The level shifter flip-flop section 2A is implemented by a flip-flop latch circuit, which includes the first branch including the p-channel MOS transistor M13 and an n-channel MOS transistor M14, and the second branch including the p-channel MOS transistor M15 and an n-channel MOS transistor M16. A power source voltage VCC2 is supplied to the sources of the p-channel MOS transistors M13 and M15, separately from the power source voltage VCC1 supplied to the inverter section 1. The gates of the p-channel MOS transistors M13 and M15 are supplied with the output and the input of the inverter section 1, respectively, as mentioned above. The drains of the p-channel MOS transistor M13 and the n-channel MOS transistor M14 are connected together.

The drains of the p-channel MOS transistor M15 and the n-channel MOS transistor M16 are connected together to the output node OUT of the voltage converting buffer circuit. The gates of the n-channel MOS transistors M14 and M16 are connected with the drains of the p-channel MOS transistors M15 and M13, respectively. The sources of the n-channel MOS transistors M14 and M16 are grounded.

In the present embodiment, unbalance is introduced in the driving capability of the MOS transistors in the level shifter flip-flop section 2A, in which the driving capability of the p-channel MOS transistors M13 and M15 is designed to be larger than that of the n-channel MOS transistors M14 and M16. Specifically, such unbalance can be implemented by setting the gate widths of the p-channel MOS transistors and the n-channel MOS transistors at 10 $\mu$m and 3 $\mu$m, respectively, for example.

In the delayed driving section 3A, the source of the n-channel MOS transistor M17 is grounded. The gate of the n-channel MOS transistor M17 is connected with the gate of the n-channel MOS transistor M16 in the second branch. The drain of the n-channel MOS transistor M17 is connected to the source of the n-channel MOS transistor M18, the drain of the n-channel MOS transistor M18 is connected to the output of the level shifter flip-flop section 2A (i.e. the node connecting the drains of the p-channel MOS transistor M15 and the n-channel MOS transistor M16 together), which constitutes the output node OUT of the voltage converting buffer circuit. The delay block 4 is connected between the output node OUT and the gate of the n-channel MOS transistor M18, so as to transmit the output of the level shifter flip-flop section 2A to the gate of the n-channel MOS transistor M18 with a predetermined delay time.

In operation, when the input node IN is at a high level, the p-channel MOS transistor M1 is OFF and the n-channel MOS transistor M2 is ON, whereby the output of the inverter section 1 is maintained at a low level. Thus, the p-channel MOS transistors M13 and M15 are ON and OFF, respectively. Accordingly, the gate of the n-channel MOS transistor M16 is at a high level to turn the MOS transistor M16 ON, and thus the output node OUT is at a low level (0V).

When the input node IN is at a low level, the gate of the p-channel MOS transistor M1 is ON and the gate of the n-channel MOS transistor M2 is OFF, whereby the output of the inverter section 1 is maintained at a high level. Thus, the p-channel MOS transistors M13 and M15 are OFF and ON, respectively, and accordingly, the output node OUT is at a high level (VCC2). Thus, the input data signal supplied through the input node IN is inverted by the inverter section 1 and the level of the inverted data signal is shifted to the power source voltage VCC2 by the level shifter flip-flop section 2.

When the input node IN falls from a high level to a low level, the p-channel MOS transistor M1 turns ON, which in turn pulls up the gate of the p-channel MOS transistor M13 to turn the same OFF. At the same time, the p-channel MOS transistor M15 is turned ON and pulls the output node OUT up to a high level.

Simultaneously, the n-channel MOS transistor M14 is turned ON to pull down the node "A", which connects the drains of the MOS transistor M13 and M14 together, to a low level. Thus, both the n-channel MOS transistors M16 and M17 are turned OFF. Thereafter, the high level of the output node OUT is transmitted through the delay block 4 and turns the n-channel MOS transistor M18 ON. Thus, the output node OUT rises from a low level to a high level by responding to the input node falling from a high level to a low level.

When the input node IN rises from a low level to a high level, the n-channel MOS transistor M2 turns ON, and the p-channel MOS transistors M1 and M15 turn OFF. Thus, the n-channel MOS transistor M2 pulls down the gate of the p-channel MOS transistor M13 to turn the transistor M13 ON, which then turns the n-channel MOS transistors M16 and M17 ON. Only at this instant, all the n-channel MOS transistors M16, M17 and M18 are ON at the same time. Then, the combined driving current from the n-channel MOS transistors M16, M17 and M18 pulls the output node OUT down to a low level with a high speed. Thereafter, the low level of the output node OUT is transmitted through the delay block 4 and turns the n-channel MOS transistor M18 OFF. Thus, the output node falls from a high level to a low level with a high speed by responding to the rise of the input node from a low level to a high level.

In the second embodiment, the delayed driving section including the delay block 4 and the n-channel pull-down transistors M17 and M18 provides a high-speed transition of the output node OUT from a high level to a low level and from a low level to a high level.

Since the above embodiments are described only for examples, the present invention is not limited to the above embodiments and various modifications or alterations can be easily made therefrom by those skilled in the art without departing from the scope of the present invention.

What is claimed is:

1. A voltage converting buffer circuit comprising:

an inverter section, connected between a first source line and a second source line, for receiving an input data signal to output an inverted data signal;

a flip-flop latch circuit having first and second branches both connected between a third source line and the second source line so as to implement a flip-flop function between said first branch and said second branch, each of said branches including a p-channel transistor and an n-channel transistor, said first and second branches receiving the input data signal and the inverted data signal, respectively, to output a level shifted data signal from a first node connecting said p-channel transistor and said n-channel transistor in said second branch; and a delayed driving section including first and second pull transistors connected between said second source line or said third source line and said first node, each of said first and second pull transistors having a conductivity same as a conductivity of one of said p-channel transistor and said n-channel transistor having a smaller driving capability compared to the other in each of said first and second branches, said first pull transistor having a gate for receiving an output from a second node connecting said p-channel transistor and said n-channel transistor in said first branch, and a delay block for receiving an output from said first node to deliver a delayed output to a gate of said second pull transistor.

2. The voltage converting buffer circuit as defined in claim 1, wherein said delay block has a delay time longer than a time length needed for said flip-flop function.

3. The voltage converting buffer circuit as defined in claim 1, wherein said inverter section comprises a CMOS-FET.

4. The voltage converting buffer circuit as defined in claim 1, wherein said n-channel transistors in said flip-flop latch circuit have a larger driving capability compared to said p-channel transistors in flip-flop latch circuit.

5. The voltage converting buffer circuit as defined in claim 4, wherein the input data signal and the inverted data signal are supplied to a gate of said n-channel transistor in said first branch and a gate of said n-channel transistor in said second branch, respectively.

6. The voltage converting buffer circuit as defined in claim 1, wherein said p-channel transistors in said flip-flop latch circuit have a larger driving capability compared to said n-channel transistors in said flip-flop latch circuit.

7. The voltage converting buffer circuit as defined in claim 6, wherein the input data signal and the inverted data signal are supplied to a gate of said p-channel transistor in said second branch and a gate of said p-channel transistor in said first branch, respectively.

* * * * *